(12) United States Patent
Hsiung et al.

(10) Patent No.: US 6,876,313 B2
(45) Date of Patent: Apr. 5, 2005

(54) ROTARY KNOB STRUCTURE

(75) Inventors: I Hsiung, Hsing-Ping (CN); Chi-Jen Hsueh, Taipei (TW)

(73) Assignee: Silitek Corporation, Taipei (TW)

( * ) Notice: Subject to any disclaimer, the term of this patent is extended or adjusted under 35 U.S.C. 154(b) by 554 days.

(21) Appl. No.: 10/118,907

(22) Filed: Apr. 10, 2002

(65) Prior Publication Data

US 2003/0112160 A1 Jun. 19, 2003

(30) Foreign Application Priority Data

Dec. 14, 2001 (TW) .................................. 90221932 U

(51) Int. Cl.$^7$ ............................................. H03M 11/00
(52) U.S. Cl. ........................ 341/35; 341/34; 341/20; 200/310; 200/313; 200/316; 362/76; 362/29
(58) Field of Search .......................... 341/34, 20, 35; 200/310, 313, 314, 316; 362/29, 26

(56) References Cited

U.S. PATENT DOCUMENTS

| | | | | | |
|---|---|---|---|---|---|
| 4,800,466 A | * | 1/1989 | Bauer et al. | ................... | 362/26 |
| 6,066,225 A | * | 5/2000 | Lopes | ........................ | 156/245 |
| 6,155,691 A | * | 12/2000 | Miyasaka | .................... | 362/30 |
| 6,531,669 B1 | * | 3/2003 | Miller et al. | ................ | 200/313 |

\* cited by examiner

*Primary Examiner*—Albert K. Wong
(74) *Attorney, Agent, or Firm*—Birch, Stewart, Kolasch, & Birch, LLP.

(57) ABSTRACT

A rotary knob, particularly an illuminant rotary knob, provides function selection and execution through single-handed operation. The invention includes a light transparent light guide to couple with a compiling controller to facilitate user operations. A plurality of illuminant elements are located around the compiling controller to project light through the light guide to give the rotary knob an illuminant effect.

7 Claims, 2 Drawing Sheets

ROTARY KNOB STRUCTURE

FIELD OF THE INVENTION

The invention relates to a rotary knob structure adopted for use on a keyboard, and particularly to an illuminant rotary knob structure that provides function selection and execution through single-handed operation.

BACKGROUND OF THE INVENTION

Mouse devices and keyboards are main interfaces for users to communicate with computers. A mouse can control the cursor to move to the location of a corresponding function selection item to do input. A keyboard may be used to input notations such as characters and numerals. In many operating conditions, the mouse and keyboard are used interchangeably. In order to reduce interchangeable usage situations for the mouse and keyboard, a shuttle rotary knob has been designed for keyboards that has a round disk button, which may be turned for selecting a function item, then depressed to execute the selected function item. As a result, some mouse functions may be directly performed by the shuttle rotary knob. And the shuttle rotary knob can also perform many other functions not possible with the mouse. Operations thus become more convenient for users.

In addition to enhancing the friendliness of keyboards for users, research and developments for improving keyboards have also gradually become directed toward adding more fun to keyboard operations. For instance, there are keyboards that have a more beautiful appearance, and there are also keyboards which illuminate. At present, the illumination for such keyboards is mostly throughout the button keys. Keyboards with an illuminant shuttle rotary knob are still not seen in the market place.

SUMMARY OF THE INVENTION

The primary object of the invention is to provide an illuminant rotary knob structure.

The rotary knob structure according to the invention is located on a keyboard, and includes a compiling controller, a plurality of illuminant elements, a light guide and a cap. The cap is for coupling the light guide with the compiling controller. The light guide is transparent and is used to operate the compiling controller. The illuminant elements are located around the compiling controller to generate light for passing through the light guide to give the rotary knob an illuminant effect.

The foregoing, as well as additional objects, features and advantages of the invention will be more readily apparent from the following detailed description, which proceeds with reference to the accompanying drawings. The drawings are only to serve for reference and illustrative purposes, and are not intended to limit the scope of the invention.

DESCRIPTION OF THE PREFERRED EMBODIMENT

Figure 1:
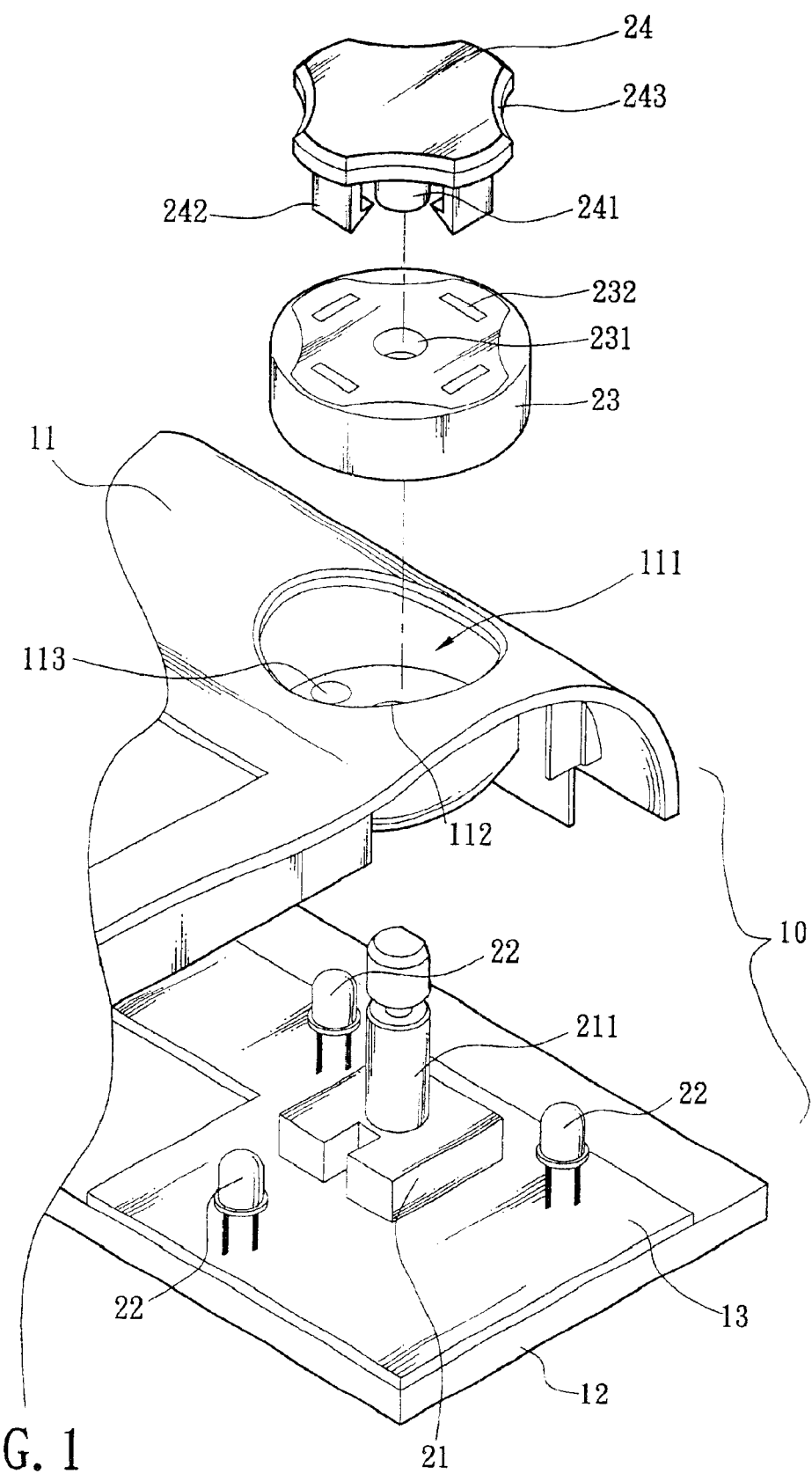
FIG. 1 is an exploded view of the invention, partly cut away.
Figure 2:
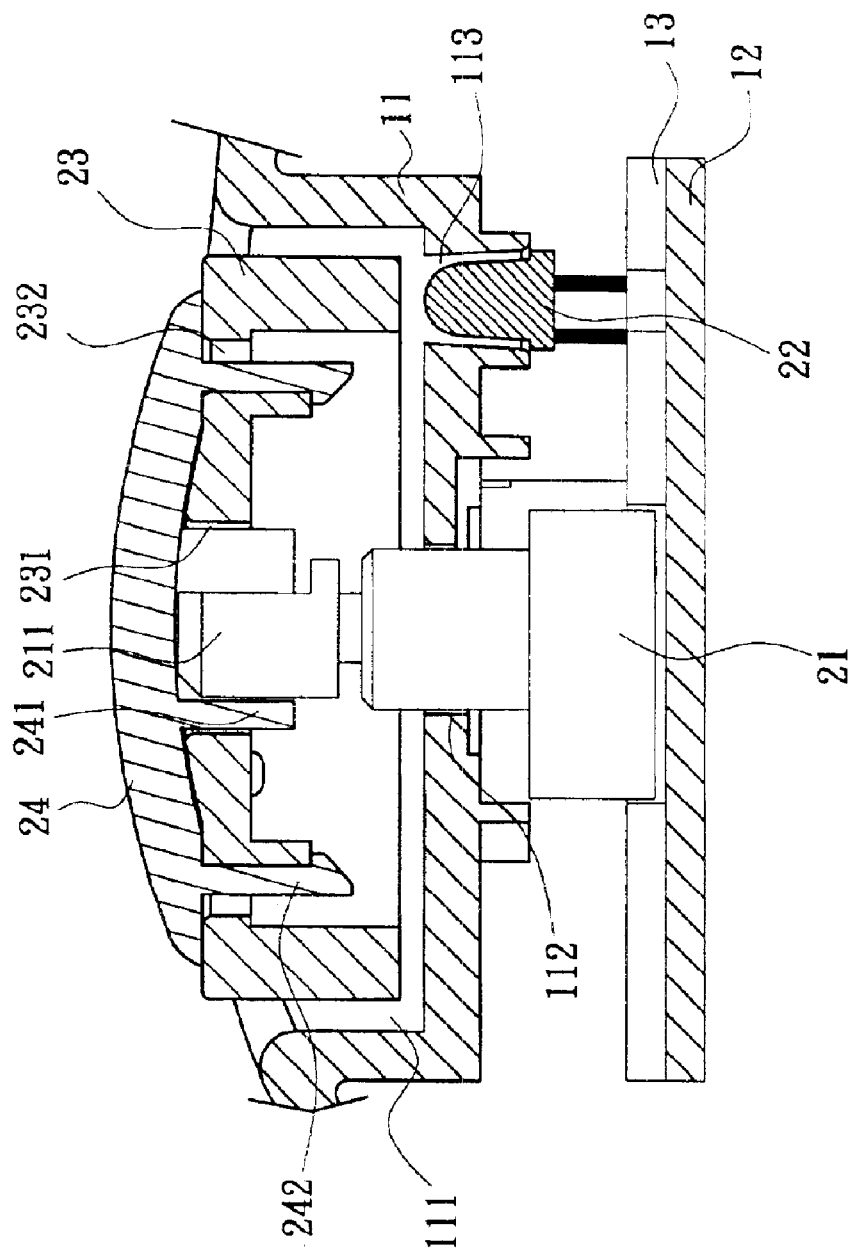
FIG. 2 is a sectional view of the invention.

Referring to FIGS. 1 and 2, the rotary knob of the invention is located on a keyboard 10. The keyboard 10 consists of an upper casing 11, a lower casing 12, a circuit board 13 and a plurality of button keys (not shown in the drawings). In order to match the rotary knob of the invention, the upper casing 11 of the keyboard 10 has a round housing trough 111 which has a through center opening 112 and a plurality of apertures 113 around the center opening 112.

The rotary knob of the invention includes a compiling controller 21, a plurality of illuminant elements 22, a light guide 23 and a cap 24. The compiling controller 21 is located on a circuit board 13 corresponding to the location of the housing trough 111, and has a rotary rod 211 passing through the center opening 112. The compiling controller 21 is turned by the rotary rod 211 to output corresponding signals. Furthermore, the rotary rod 211 may be depressed to output execution signals.

The illuminant elements 22 are located on the circuit board 13 around the compiling controller 21, and are respectively housed in the apertures 113 for emitting light through the apertures 113. The illuminant elements 22 may be light emitting diodes or small bulbs, or the like.

The light guide 23 is a round disk with a diameter slightly smaller than the inner diameter of the housing trough 111 so that the light guide 23 may be turned in the housing trough 111. The light guide 23 has a bore 231 formed in the center thereof and a plurality of through slots 232 around the bore 231. The light guide 23 is transparent to allow light to pass through.

The cap 24 is smaller than the outside diameter of the light guide 23 and has a coupling sleeve 241 located in the center of the bottom section to pass through the bore 231 for engaging with the rotary rod 211 of the compiling controller 21. The cap 24 further has a plurality of latch hooks 242 located on the bottom section for passing through the slots 232 to engage with the light guide 23. The cap 24 is opaque, and has indented notches 243 formed on locations corresponding to the illuminant elements 22.

Referring to FIG. 2, the compiling controller 21 is located on the circuit board 13 with the rotary rod 211 passing through the center opening 112 and housed in the housing trough 111. The illuminant elements 22 are housed in the apertures 113 around the compiling controller 21. The cap 24 is coupled with the light guide 23 by engaging the latch hooks 242 with the slots 232. The cap 24 and light guide 23 are also coupled and housed in the housing trough 111 with the coupling sleeve 241 of the cap 24 engaging with the rotary rod 211 of the compiling controller 21. The light guide 23 and the bottom surface of the housing trough 111 form a gap to allow the light guide 23 to turn under depression from users for controlling the compiling controller 21 to output corresponding signals, and also to provide a downward displacement to output execution signals.

The rotary knob structure of the invention has a plurality of illuminant elements 22 to generate light that is projected through the light guide 23 to give the rotary knob an illuminant effect. In addition, the illuminant elements 22 may blink sequentially, or blink entirely, or blink alternately according to operations (such as turning or executing) of the compiling controller 21, thus generate a more amusing effect during operations.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A rotary knob structure located on a keyboard, comprising:
   a compiling controller located on the keyboard, which has a rotary rod that outputs corresponding signals when turned and outputs execution signals when pressed;
   a plurality of illuminant elements located around the compiling controller;
   a light guide located on the keyboard at a location corresponding to the compiling controller, which is light transparent; and
   a cap latched on the light guide and coupled with the rotary rod of the compiling controller, for controlling the light guide to turn the rotary rod.

2. The rotary knob structure of claim 1, wherein the keyboard has a housing trough for housing the light guide and the cap.

3. The rotary knob structure of claim 1, wherein the compiling controller and the illuminant elements are located on a circuit board housed in the keyboard.

4. The rotary knob structure of claim 1, wherein the illuminant elements are light emitting diodes (LEDs).

5. The rotary knob structure of claim 1, wherein the illuminant elements are small bulbs.

6. The rotary knob structure of claim 1, wherein the light guide has a plurality of through slots, the cap having latch hooks located on a bottom section for passing through the slots and engaging the cap on the light guide.

7. The rotary knob structure of claim 1, wherein the light guide has an aperture in the center thereof; the cap having a coupling sleeve located on a bottom section in the center thereof to pass through the bore for coupling with the rotary rod of the compiling controller.

* * * * *